(12) United States Patent
Yamasaki et al.

(10) Patent No.: US 6,764,575 B1
(45) Date of Patent: Jul. 20, 2004

(54) MAGNETRON PLASMA PROCESSING APPARATUS

(75) Inventors: Tomomi Yamasaki, Himeji (JP); Hidetoshi Kimura, Nirasaki (JP); Junichi Arami, Tokyo (JP); Hiroo Ono, Nirasaki (JP); Akira Koshiishi, Nirasaki (JP); Koji Miyata, Takefu (JP)

(73) Assignees: Tokyo Electron Limited, Tokyo (JP); Shin-Etsu Chemical Co., Ltd., Tokyo (JP)

( * ) Notice: Subject to any disclaimer, the term of this patent is extended or adjusted under 35 U.S.C. 154(b) by 78 days.

(21) Appl. No.: 10/069,512

(22) PCT Filed: Aug. 28, 2000

(86) PCT No.: PCT/JO00/05798

§ 371 (c)(1),
(2), (4) Date: Mar. 4, 2002

(87) PCT Pub. No.: WO01/18858

PCT Pub. Date: Mar. 15, 2001

(30) Foreign Application Priority Data

Sep. 2, 1999 (JP) ............................................ 11-248693

(51) Int. Cl.$^7$ .......................... C23C 14/34; C23C 16/00; H01L 21/306
(52) U.S. Cl. ............................. 156/345.46; 204/298.16; 204/298.37; 118/723 E; 118/723 MR; 118/723 MA; 118/723 R; 156/345.42; 156/345.49
(58) Field of Search ....................... 204/298.16, 298.37; 118/723 R, 723 MR, 723 MA, 723 E; 156/345.42, 345.46, 345.49

(56) References Cited

U.S. PATENT DOCUMENTS

| 5,444,207 A | 8/1995 | Naritay et al. .......... 219/121.43 |
| 5,717,294 A | * 2/1998 | Sakai et al. ............. 315/111.41 |
| 6,014,943 A | 1/2000 | Miyata et al. ........... 118/723 E |

FOREIGN PATENT DOCUMENTS

EP            762471        3/1997

\* cited by examiner

*Primary Examiner*—Rodney G. McDonald
(74) *Attorney, Agent, or Firm*—Oblon, Spivak, McClelland, Maier & Neustadt, P.C.

(57) ABSTRACT

When a substrate 30 is to be subjected to a magnetron plasma process, a dipole ring magnet 21 is provided, in which a large number of anisotropic segment magnets 22 are arranged in a ring-like shape around the outer wall of a chamber 1. A magnetic field gradient, wherein the magnetic field strength decreases from the E pole side toward the W pole side in a direction perpendicular to a magnetic field direction B, is formed in a plane perpendicular to the direction of an electric field between a pair of electrodes separated from each other. The anisotropic segment magnets have a first section a including anisotropic segment magnets arranged in the vicinity of a region A located outside an E pole side end of the process substrate with an N pole thereof being directed toward this region, and a second portion b including anisotropic segment magnets arranged with an S pole thereof being directed toward this region, to locally increase the magnetic field strengths of the first and second regions.

13 Claims, 5 Drawing Sheets

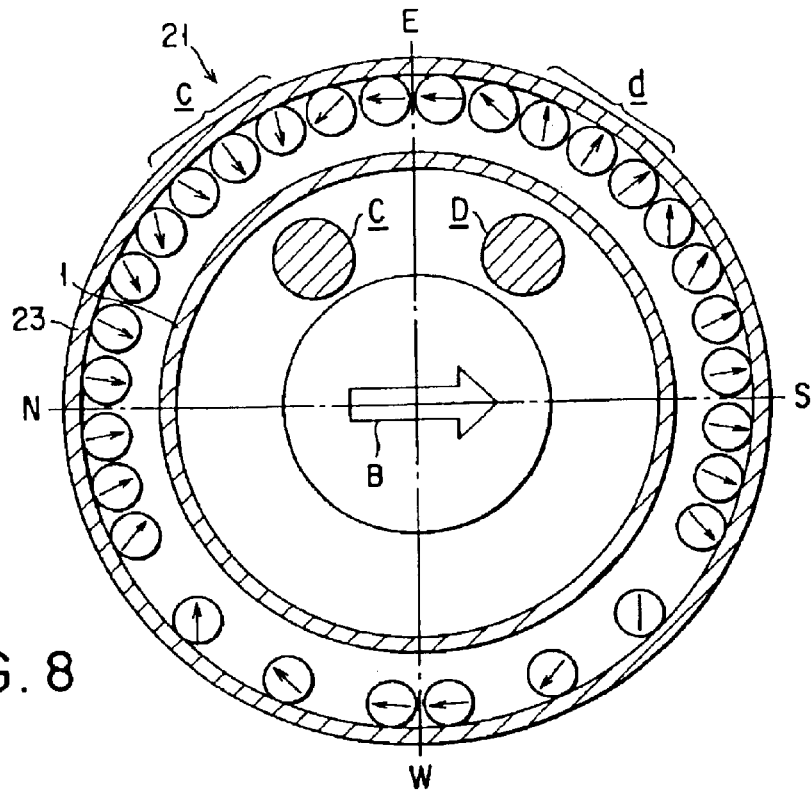
FIG. 8
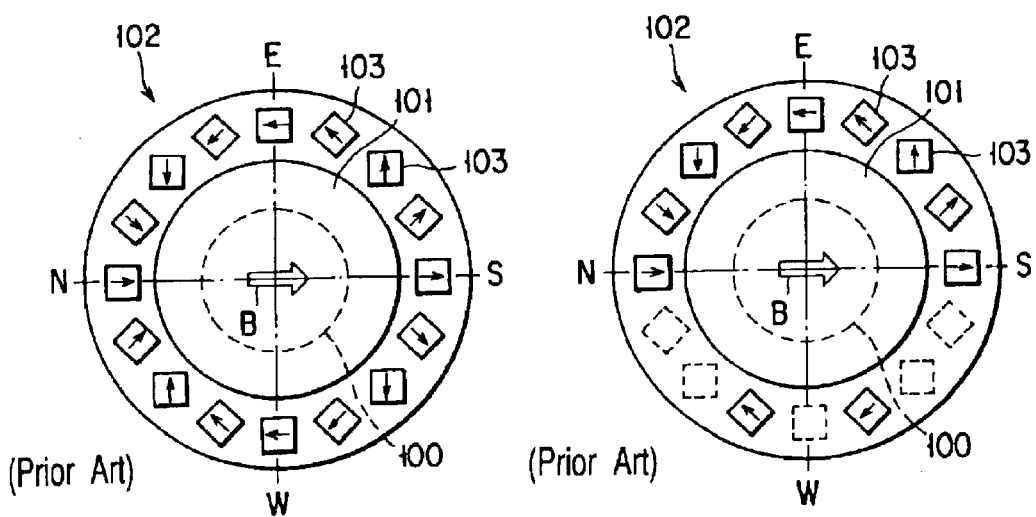
(Prior Art)
FIG. 9
(Prior Art)
FIG. 10

MAGNETRON PLASMA PROCESSING APPARATUS

TECHNICAL FIELD

The present invention relates to a magnetron plasma processing apparatus for processing a target substrate such as a semiconductor wafer with a magnetron plasma.

BACKGROUND ART

In recent years, a magnetron plasma etching apparatus for performing micropattern etching by generating a high-density plasma in a comparatively low-pressure atmosphere has been put into practical use. In this apparatus, a permanent magnet is arranged above a chamber. The magnetic field produced by the permanent magnet is applied horizontally to a semiconductor wafer. An RF electric field perpendicular to the magnetic field is simultaneously applied to the semiconductor wafer. The drift motion of electrons caused upon application of the magnetic and electric fields is utilized to etch the semiconductor wafer with a very high efficiency.

In the magnetron plasma, what contributes to the drift motion of electrons is a magnetic field perpendicular to the electric field, i.e., a magnetic field horizontal to the semiconductor wafer. As a uniform horizontal magnetic field is not always formed in the above apparatus, plasma uniformity is not sufficient. Thus, a nonuniform etching rate, charge-up damage, and the like may occur.

In order to avoid these problems, formation of a horizontal magnetic field uniform with respect to the semiconductor wafer in the processing space in the chamber is sought. As a magnet that can generate such a magnetic field, a dipole ring magnet is known. As shown in FIG. 9, this dipole ring magnet 102 is formed by arranging a plurality of anisotropic segment columnar magnets 103 in a ring-like shape outside a chamber 101. The directions of magnetization of the plurality of anisotropic segment columnar magnets 103 are slightly shifted from each other to form a uniform horizontal magnetic field B as a whole. FIG. 9 is a view (plan view) of the apparatus seen from above. The proximal end side of the direction of the magnetic field is indicated by N, the distal end side thereof is indicated by S, and positions separated 90° from N and S are respectively indicated by E and W. In FIG. 9, reference numeral 100 denotes a semiconductor wafer.

The horizontal magnetic field formed by the dipole ring magnet in this manner is a horizontal magnetic field directed only in one direction of from N to S in FIG. 9. Accordingly, electrons travel in one direction by drift motion, causing nonuniformity in the plasma density. More specifically, the electrons drift in the direction of the outer product of the electric field and the magnetic field. In other words, when the electric field is formed to extend downward from above, the electrons travel from the E pole side to the W pole side by drift motion. Consequently, the plasma density is low on the E pole side and high in the W pole side, resulting in nonuniformity.

To prevent this, the dipole ring magnet is rotated in its circumferential direction to form a rotating magnetic field, so the direction of drift motion of electrons is changed. In practice, however, this cannot make the plasma density sufficiently uniform over a wide range.

A technique has been proposed in which a magnetic field gradient is formed in the drift direction of electrons, i.e., in a direction from the E pole side to the W pole side in FIG. 9, so the nonuniformity of plasma accompanying the drift motion of electrons is eliminated (Jpn. Pat. Appln. KOKAI Publication No. 9-27278). According to this technique, as shown in FIG. 10, the number of anisotropic segment columnar magnets on the W pole side is made smaller than that on the E pole side. As a result, a gradient is formed in which the magnetic field strength increases in the direction from the E pole side to the W pole side.

In recent years, devices have been required to shrink more and more in feature size, and a plasma etching process in a lower pressure has been required. To perform an efficient plasma process in a low pressure, the plasma density must be further increased. For this purpose, in the magnetron plasma process, the magnetic field strength may be increased.

When, however, an insulating film such as an oxide film is to be etched, to avoid charge-up damage, the magnetic field strength of that portion where a wafer is present is limited to about 200 Gauss at maximum. Even when a magnetic field gradient is formed by the above technique and plasma uniformity can be achieved, the plasma density cannot be sufficiently increased, and the etching rate may not be sufficiently high. If a region where the magnetic field is locally strong can be formed outside the E pole-side end of the wafer, the plasma density may be increased without damaging the wafer. Conventionally, however, it is difficult to locally form a strong magnetic field portion.

DISCLOSURE OF INVENTION

It is an object of the present invention to provide a magnetron plasma processing apparatus which can form a locally strong magnetic field portion at a desired position in a processing space for a target object, so the plasma density of the processing space can be increased.

According to a first aspect of the present invention, there is provided a magnetron plasma processing apparatus which comprises a chamber with an outer wall that can maintain a reduced pressure, process gas supply means for supplying a process gas into the chamber, a pair of electrodes arranged in the chamber to oppose each other and to define a processing space therebetween, electric field forming means for applying a voltage to the pair of electrodes, thus forming an electric field in the processing space, and magnetic field forming means for forming, in the processing space, a magnetic field perpendicular to the direction of the electric field and directed in one direction, and which subjects a target substrate to a magnetron plasma process while the target substrate is set in the processing space to be parallel to the electrodes, the magnetic field forming means having a dipole ring magnet including a plurality of first anisotropic segment magnets arranged in a ring-like shape around the outer wall of the chamber so as to form a magnetic field gradient, within a plane perpendicular to the direction of the electric field, such that a magnetic field strength is large and small on upstream and downstream sides, respectively, in an electron drift direction along a direction perpendicular to a direction of the magnetic field, at least one second anisotropic segment magnet, arranged in the vicinity of a predetermined region located outside that end of the target substrate which is on the upstream side in the electron drift direction, with an N pole thereof being directed toward the predetermined region, and at least one third anisotropic segment magnet arranged in the vicinity of the predetermined region with an S pole thereof being directed toward the predetermined region, the second and third anisotropic segment magnets serving to locally increase the magnetic field strength of the predetermined region to be larger than that formed by the first anisotropic segment magnets.

According to a second aspect of the present invention, there is provided a magnetron plasma processing apparatus which comprises a chamber which has an outer wall and can maintain reduced pressure, process gas supply means for supplying a process gas into the chamber, a pair of electrodes arranged in the chamber to oppose each other and to define a processing space therebetween, electric field forming means for applying a voltage to the pair of electrodes, thus forming an electric field in the processing space, and magnetic field forming means for forming, in the processing space between the pair of electrodes, a magnetic field perpendicular to the direction of the electric field and directed in one direction, and which subjects a target substrate to a magnetron plasma process while the target substrate is set in the processing space to be parallel to the electrodes, the magnetic field forming means having a dipole ring magnet including a large number of anisotropic segment magnets arranged in a ring-like shape around the outer wall of the chamber, to form a magnetic field gradient, within a plane perpendicular to the direction of the electric field between the electrodes, such that the magnetic field strength is large and small on upstream and downstream sides, respectively, in an electron drift direction along a direction perpendicular to the direction of the magnetic field, and the plurality of anisotropic segment magnets including a first portion including at least one anisotropic segment magnet arranged in the vicinity of a first region located outside that end of the target substrate which is on the upstream side in the electron drift direction with an N pole thereof being directed toward the first region, and a second portion including at least one anisotropic segment magnet, arranged in the vicinity of a second region located outside that end of the target substrate which is on the upstream side in the electron drift direction, to be away from the first region, with an S pole thereof being directed toward the second region, the first and second portions serving to locally increase magnetic field strengths of the first and second regions.

With the above arrangement, a strong magnetic field portion can be locally formed at a predetermined region located outside that end of the target substrate which is on the upstream side in the electron drift direction. The plasma density of the processing space can accordingly be increased.

Preferably, the anisotropic segment magnets are arranged such that gaps among those which are on the upstream side in the electron drift direction are narrower than gaps among those which are on the downstream side in the electron drift direction.

The anisotropic segment magnets preferably form a magnetic field with 200 Gauss at maximum, preferably 100 Gauss to 200 Gauss, at a portion thereof opposing the target substrate, and a magnetic field of at least 200 Gauss, preferably 200 Gauss to 400 Gauss, at the predetermined region.

BRIEF DESCRIPTION OF DRAWINGS

FIG. 8 is a horizontal sectional view of a dipole ring magnet arranged around the chamber of a magnetron plasma etching apparatus according to another embodiment of the present invention;

FIG. 9 is a schematic view showing a conventional dipole ring magnet; and

FIG. 10 is a schematic view showing a conventional dipole ring magnet.

BEST MODE FOR CARRYING OUT OF THE INVENTION

The embodiments of the present invention will be described with reference to the accompanying drawings.

Figure 1:
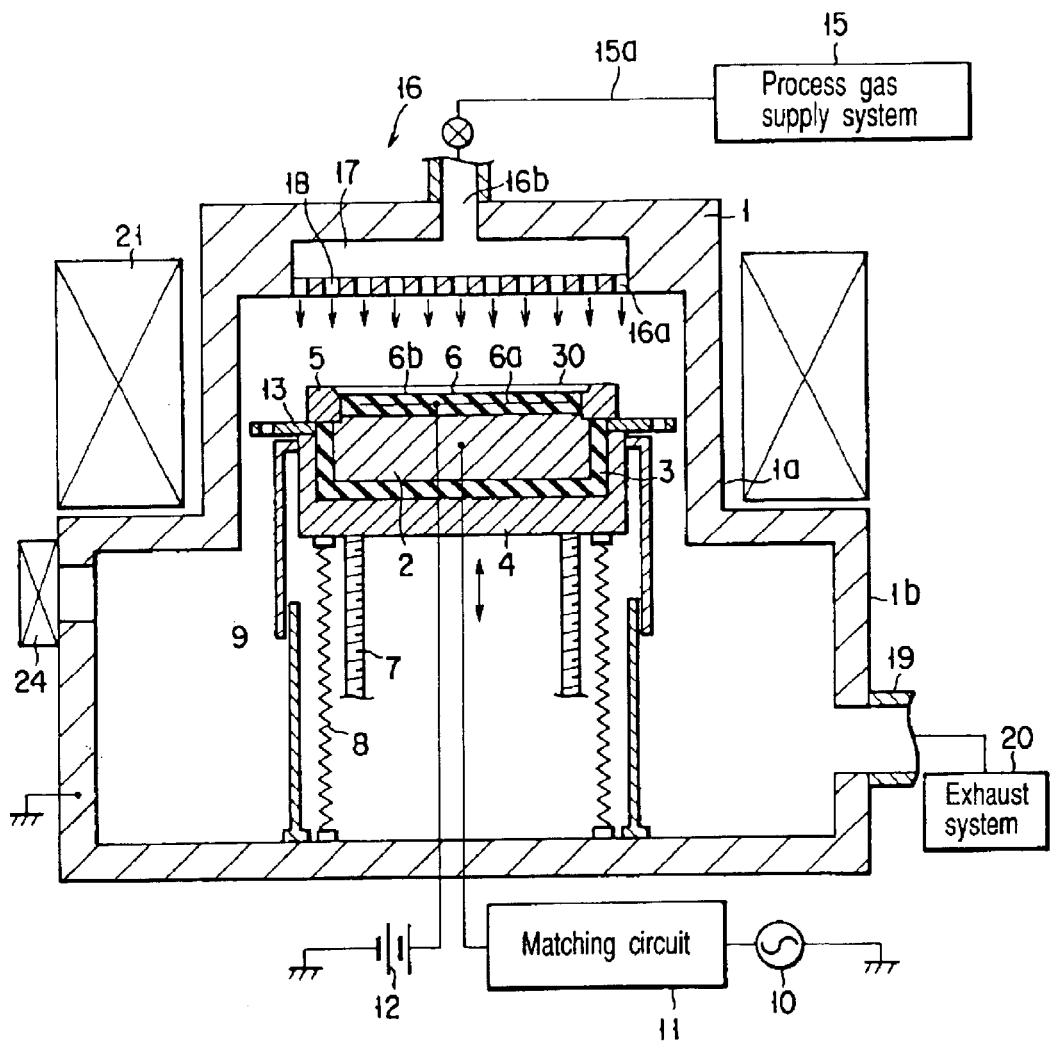
FIG. 1 is a sectional view showing a magnetron plasma etching apparatus according to an embodiment of the present invention.

FIG. 1 is a sectional view showing a magnetron plasma etching apparatus according to an embodiment of the present invention. This etching apparatus has an airtight chamber 1. The chamber 1 forms a stepped cylindrical shape constituted by a small-diameter upper portion 1a and large-diameter lower portion 1b. The wall of the chamber 1 is made of a conductor such as aluminum. A support table 2 for horizontally supporting a semiconductor wafer 30 as a target object thereon is arranged in the chamber 1. For example, the support table 2 is formed of an aluminum circular plate, and is supported on a conductive support base 4 through an insulating plate 3. A conductive focus ring 5 made of, e.g., single-crystal silicon, is arranged on the periphery of an upper surface of the support table 2. The support table 2 and support base 4 can be vertically moved with respect to the chamber 1 by a known ball screw mechanism in directions indicated by arrows. The ball screw mechanism has at least one (two in this embodiment) ball screw 7 and a motor (not shown) for rotating the screw. A driving portion under the support base 4 is covered by a stainless steel (SUS) bellows 8 set between the support base 4 and the bottom wall of the chamber 1. A bellows cover 9 formed of a pair of slidable cylinders is arranged outside the bellows 8.

The support table 2 is connected to an RF power supply 10 through a matching box, i.e., a circuit 11. The RF power supply 10 supplies RF power of, e.g., 13.56 MHz, to the support table 2. A shower head 16 (to be described later) is arranged above the support table 2 to oppose and be parallel to it. The shower head 16 makes up the upper portion of the small-diameter portion of the chamber 1. The shower head 16 is grounded. Thus, the shower head 16 and support table 2 serve as a pair of parallel electrodes.

An electrostatic chuck 6 for electrostatically chucking the semiconductor wafer 30 with a diameter of 300 mm is arranged on the surface of the support table 2. The electrostatic chuck 6 is surrounded by the focus ring 5. The electrostatic chuck 6 is constituted by a pair of insulators 6b, and an electrode 6a interposed between them and connected to a DC power supply 12. The power supply 12 applies a voltage to the electrode 6a, so that the semiconductor wafer 30 can be chucked on the electrostatic chuck with a Coulomb force.

A refrigerant channel (not shown) is formed in the support table 2. When an appropriate refrigerant is circulated in the refrigerant channel, the semiconductor wafer 30 can be controlled to a predetermined temperature. A baffle plate 13 is formed outside the focus ring 5 and electrically connected to the chamber 1 through the support base 4 and bellows 8.

The shower head 16 has a lower plate 16a with a large number of gas discharge holes 18. A gas inlet portion 16b is formed at the center of the upper wall of the chamber 1 which is located above the lower plate 16a. A space 17 is formed in the shower head, i.e., between the lower plate 16a and the upper wall. The gas inlet portion 16b is connected to one end of a gas supply pipe 15a. The other end of the gas supply pipe 15a is connected to a process gas supply system 15 for supplying a process gas. The process gas consists of an etching reaction gas and diluent gas. As the reaction gas, a halogen-based gas can be used. As the diluent gas, a gas ordinarily used in this field, e.g., Ar gas, He gas, or the like can be used.

The process gas is supplied from the process gas supply system 15 through the gas supply pipe 15a and gas inlet portion 16b in the space 17 of the shower head 16, and then discharged from the gas discharge holes 18 to etch a film formed on the semiconductor wafer 30.

An exhaust port 19 is formed in the side wall of the lower portion 1b of the chamber 1, and is connected to an exhaust system 20. When a vacuum pump provided in the exhaust system 20 is actuated, the interior of the chamber 1 can be reduced to a predetermined vacuum degree. A gate valve 24 is provided on the upper side of the side wall of the lower portion 1b of the chamber 1. The gate valve 24 opens and closes a loading/unloading port for the semiconductor wafer 30.

A dipole ring magnet 21 is concentrically arranged around the upper portion 1a of the chamber 1. The dipole ring magnet 21 forms a horizontal magnetic field in the processing space between the support table 2 and shower head 16. The dipole ring magnet 21 can be rotated by a rotating means such as a motor (not shown) about the central axis of the upper portion 1a as the center.

In the magnetron plasma etching apparatus with the above arrangement, first, the gate valve 24 is opened. The semiconductor wafer 30 is loaded into the chamber 1 and placed on the support table 2. At this time, the DC power supply 12 applies a predetermined voltage to the electrode 6a of the electrostatic chuck 6. The semiconductor wafer 30 is chucked on the electrostatic chuck with a Coulomb force.

After this, the support table 2 is moved upward to the position shown in FIG. 1. The vacuum pump of the exhaust system 20 evacuates the interior of the chamber 1 through the exhaust port 19.

After the interior of the chamber 1 reaches the predetermined vacuum degree, a predetermined process gas is introduced into the chamber 1 from the process gas supply system 15. The interior of the chamber 1 is thus held at a predetermined pressure, e.g., 50 mTorr. In this state, the RF power supply 10 supplies RF power to the support table 2. For example, the RF power has a frequency of 13.56 MHz and a power of 1,000 W to 5,000 W.

In this case, the RF power is applied in the above manner to the support table 2 serving as a lower electrode. Thus, a vertical electric field is formed in the processing space between the shower head 16 serving as the upper electrode and the support table 2 serving as the lower electrode. A horizontal magnetic field is formed in the upper portion 1a of the chamber 1 by the dipole ring magnet 21. Therefore, magnetron discharge occurs in the process gas due to the drift of electrons, thus forming a process gas plasma. The process gas plasma etches a predetermined film formed on the semiconductor wafer 30.

The dipole ring magnet will be described.

Figure 2:
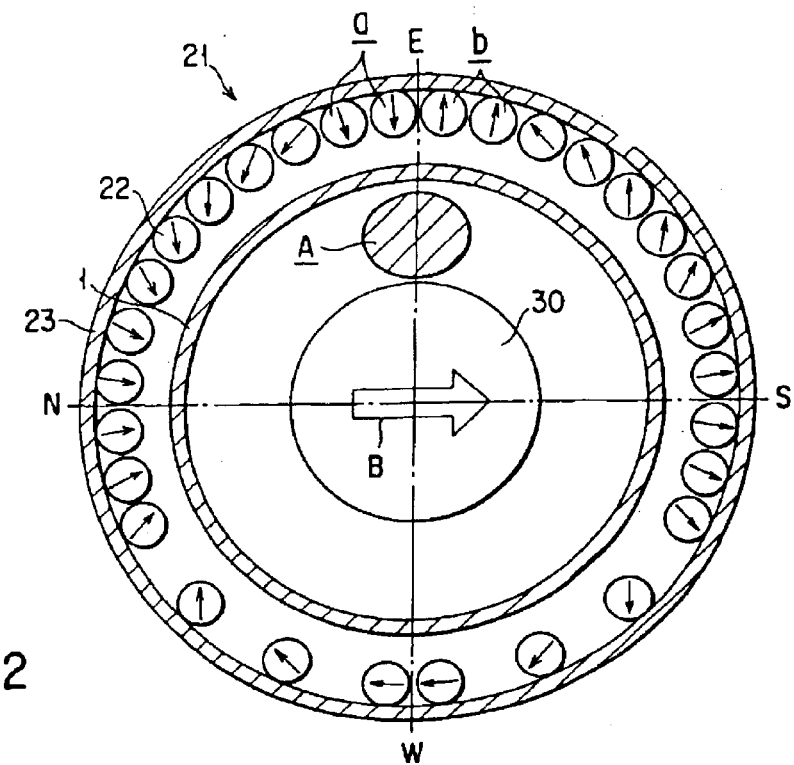
FIG. 2 is a horizontal sectional view of a dipole ring magnet arranged around the chamber of the apparatus of FIG. 1.

FIG. 2 is a cross-sectional view of the dipole ring magnet arranged around the chamber 1.

As shown in FIG. 2, the dipole ring magnet 21 is formed by attaching a large number of anisotropic segment magnets 22 to a ring-like magnetic casing 23. Each anisotropic segment magnet 22 is formed of a columnar magnet with a magnetizing direction in its radial direction. In this embodiment, 30 anisotropic segment magnets 22 are arranged in the ring-like shape. However, the number of anisotropic segment magnets is not limited to this. The sectional shape of each anisotropic segment magnet is not limited to a circle as in the embodiment, but an arbitrary shape can be employed, e.g., a square, rectangle, or trapezoid. The magnet material that forms the anisotropic segment magnets 22 is not limited particularly, and a known magnet material can be employed, e.g., a rare earth-type magnet, a ferrite-type magnet, or an Alnico magnet. The arrangement of such a dipole ring magnet and the rotating mechanism for it are disclosed in, e.g., U.S. Pat. No. 6,014,943 described herein as a reference.

In the dipole ring magnet 21, the directions of magnetization of the plurality of first-group first anisotropic segment magnets 22 are slightly shifted from each other in the same manner as in the prior art. Thus, the dipole ring magnet 21 has first-group first anisotropic segment magnets 22 that form a horizontal magnetic field B directed in one direction as a whole, as shown in FIG. 2. In FIG. 2, the proximal end side of the direction of the magnetic field is shown as an N pole side, the distal end side thereof is shown as an S pole side, and positions shifted by 90° from the N and S end sides are respectively shown as E and W poles.

Figure 3:
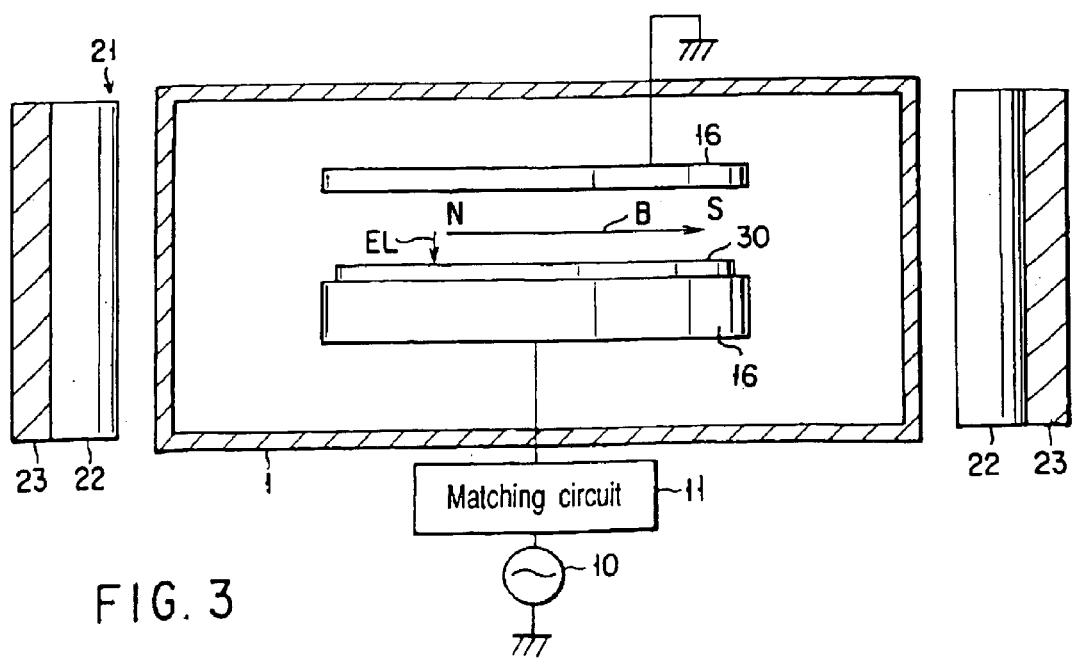
FIG. 3 is a view schematically showing the dipole ring magnet and a state in the chamber of the magnetron plasma etching apparatus of FIG. 1.

As shown in FIG. 3, a vertical electric field EL and the horizontal magnetic field B extending almost from the N pole side toward the S pole side are formed in the processing space. Thus, electrons generated by the plasma travel from the E pole side toward the W pole side by drift motion. Therefore, the electron density on the W side will increase to cause nonuniformity in plasma density. The larger the magnetic field strength, the larger the plasma density. When a magnetic field strength gradient is formed such that the magnetic field strength on the E pole side is large and that on the W pole side is small, the above problem can be solved.

For this purpose, conventionally, those anisotropic segment magnets which are on the W pole side portion are thinned out to be less than those on the E pole side. Also, the magnetic strength of the anisotropic segment magnets on the E pole side is increased. In this manner, the magnet is designed to form lines of magnetic force with which the magnetic field strength on the E pole side end of the processing space is largest and the drift electrons diffuse on the W pole side.

When the insulating film (oxide film, nitride film, or the like) on the semiconductor wafer 30 is to be etched, the magnetic field strength must be set to 200 Gauss or less even at the E pole side end where it is largest on the semiconductor wafer 30, because of possible charge-up damage. With a conventional magnetic gradient, the magnetic field strength outside the E pole side end of the wafer is not sufficiently. large. Hence, the amount of generated plasma may decrease and the etching rate may not be sufficiently high. In other words, as the feature size of the devices shrinks in recent years, a plasma etching process under a lower pressure is required. To perform an efficient plasma process under a low pressure, the plasma density must be further increased. With the conventional magnetic field gradient, however, a sufficient amount of plasma cannot be generated.

In order to solve this problem, in the dipole ring magnet 21, as shown in FIG. 2, those anisotropic segment magnets which are on the W pole side portion are thinned out to decrease the magnetic field strength of the W pole side. Also, the magnetic poles of the anisotropic segment magnets at portions indicated by reference numerals a and b in FIG. 2, in the vicinity of a region A are directed toward the region A. These anisotropic segment magnets are second and third anisotropic segment magnets. More specifically, in the anisotropic segment magnets at the portion a, the N poles are directed toward the region A. In the anisotropic segment magnets at the portion b, the S poles are directed toward the region A. When the N and S poles of the anisotropic segment magnets are directed toward the region A in this manner, the magnetic field of the region A can be locally strengthened. When the magnetic field strength of a region outside the E pole side end of the semiconductor wafer 30 is increased in this manner, the amount of plasma generated at this region can be increased. Thus, the plasma density can be increased.

Figure 4:
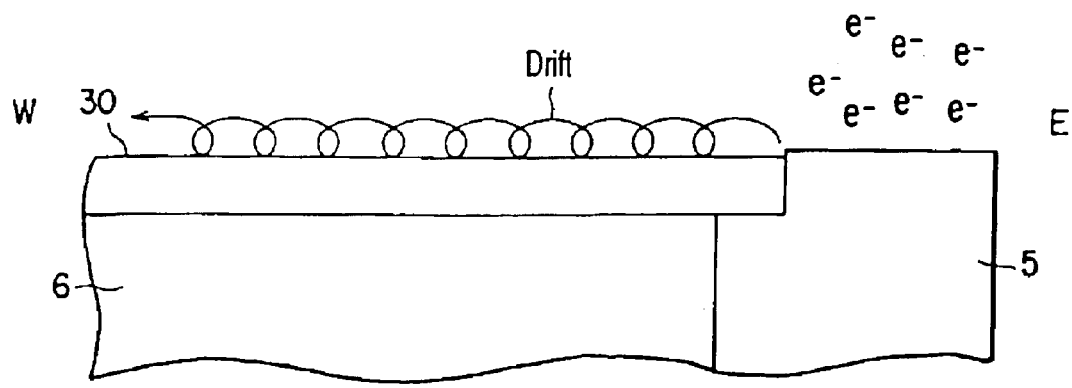
FIG. 4 is a schematic view showing the drift state of electrons generated by a focus ring in the magnetron plasma etching apparatus according to the embodiment of the present invention.

More specifically, assume that the magnetic field strength of a region outside the E pole side of the semiconductor wafer 30 is increased to preferably 200 Gauss or more. Then, as shown in FIG. 4, the amount of electrons generated on the surface of the focus ring 5 outside the E side of the semiconductor wafer 30 increases. Thus, the amount of electrons to be supplied to the W side by drift increases, and accordingly the plasma density increases.

Figure 5:
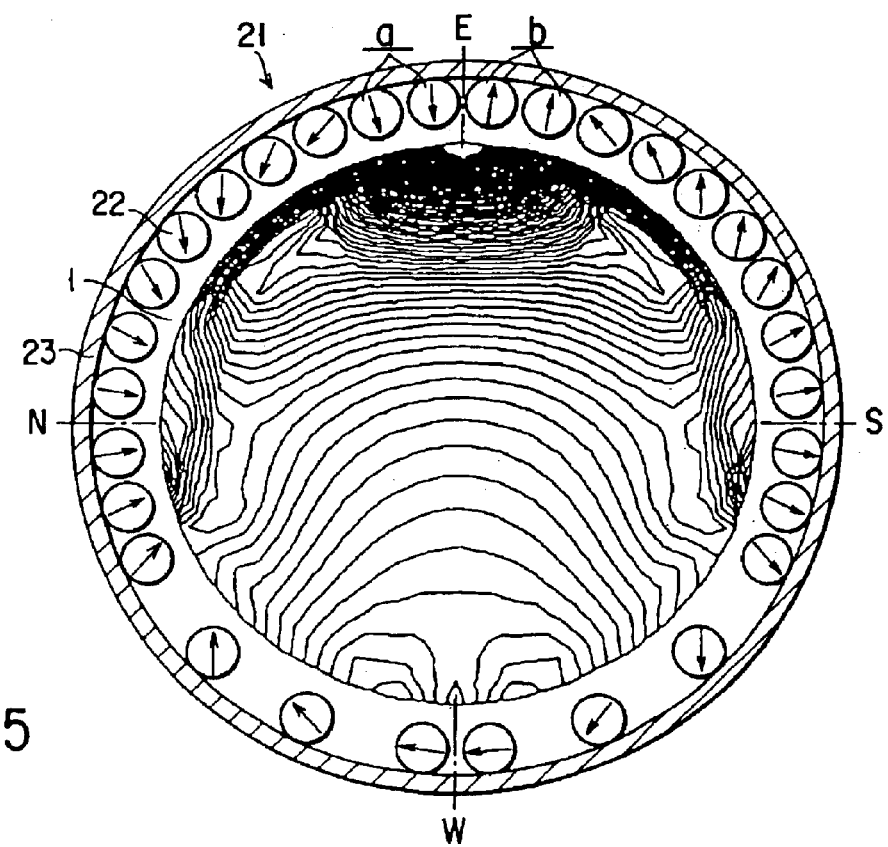
FIG. 5 is a view showing the magnetic field strength distribution of a magnetic field formed by the dipole ring magnet of FIG. 2.
Figure 6:
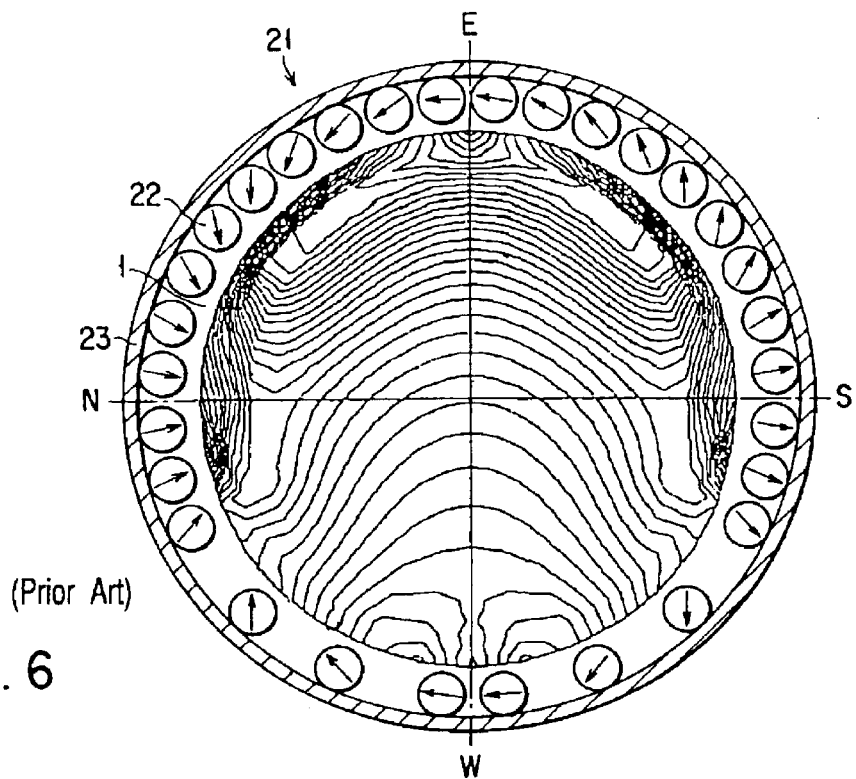
FIG. 6 is a view showing the magnetic field strength distribution of a magnetic field formed by a conventional dipole ring magnet.
Figure 7:
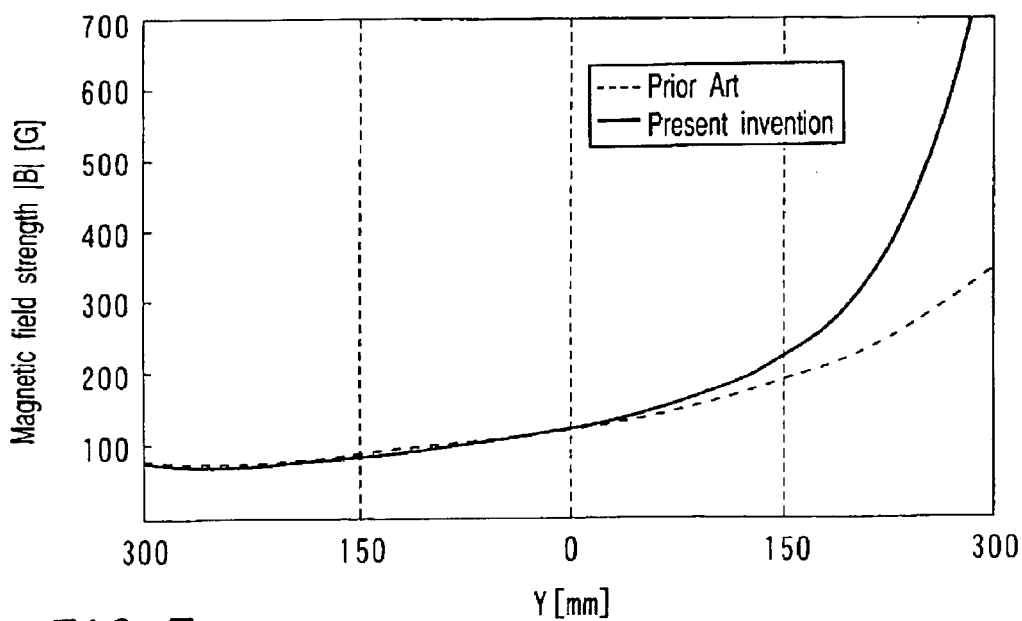
FIG. 7 is a graph showing the magnetic field strength gradient in the E-W section of the processing space of the magnetron plasma etching apparatus according to the present invention and that of a conventional magnetron plasma etching apparatus.

FIG. 5 shows the magnetic field strength distribution formed when the magnetic poles of the anisotropic segment magnets at the portions indicated by a and b are directed to the region A according to the present invention, as shown in FIG. 2. FIG. 6 shows the magnetic field strength obtained when the directions of these magnetic poles are not changed. In FIGS. 5 and 6, the isomagnetics are plotted at a spacing of 10 Gauss. A comparison of FIGS. 5 and 6 reveals the following. In FIG. 5, the spacings between the isomagnetics are dense at a portion (above the center) corresponding to the region A. The gradient of the magnetic field strength is thus steep, and the magnetic field strength is large at this portion. In contrast to this, in FIG. 6, the spacings between the isomagnetics at a portion corresponding to the region A are not very dense. The gradient of the magnetic field strength is thus moderate, and the magnetic field strength at this portion is not very large. An actual magnetic field strength gradient in an E-W section is as shown in FIG. 7. According to the present invention, the gradient of the magnetic field strength is steep at a region outside the E side end of the semiconductor wafer 30, and a magnetic field strength considerably larger than that of the prior art can be obtained.

A portion with a large magnetic field strength as described above is preferably formed over a wide range outside the E pole side of the semiconductor wafer 30. An isomagnetic strength may then be obtained over a wide range along the E pole side end of the semiconductor wafer 30 and its periphery. Then, electrons start drifting simultaneously over the wide range in the vicinity of the end region of the semiconductor wafer 30. Therefore, the plasma density can be increased easily.

From this viewpoint, as shown in FIG. 8, it is also effective to strengthen the magnetic fields of regions C and D on the two sides of an E-W line outside the E side end of the semiconductor wafer 30. In this case, as shown in FIG. 8, the magnetic pole of at least one (three in this example) anisotropic segment magnet of a portion c in the vicinity of the region C may be directed toward the region C. Also, the magnetic pole of at least one (three in this example) anisotropic segment magnet of a portion d in the vicinity of the region D may be directed toward the region D. Then, a desired magnetic field strength distribution can be obtained. More specifically, the N poles of the three anisotropic segment magnets at the portion c are directed toward the region C. Also, the S poles of the three anisotropic segment magnets at the portion d are directed toward the region D. In this manner, the N and S poles of the anisotropic segment magnets are directed toward the regions C and D, respectively. Then, in these regions, of the magnetic fields formed by the dipole ring magnet, those of the regions C and D can be locally strengthened.

The present invention is not limited to the above embodiments but can be changed in various ways. For example, in the above embodiments, a semiconductor wafer with an oxide film is used as a target substrate. However, the present invention is not limited to this, and other target substrates, e.g., an LCD substrate or a glass substrate with an insulating film, may be used. In the above embodiments, the present invention is applied to a magnetron plasma etching apparatus. However, the present invention is not limited to this, but can be applied to another plasma processing apparatus. The technique of decreasing the magnetic field strength on the W pole side so that it is smaller than that on the E pole side is not limited to changing the numbers of anisotropic segment magnets on the two pole sides, as described above. It is understood that another means can be used. For example, the numbers of anisotropic segment magnets are set equal, while the magnetic strengths thereof are made to differ. Furthermore, regarding the number of anisotropic segment magnets arranged in order to locally increase the magnetic field of a predetermined region, at least one suffices. This number can be arbitrarily selected. This anisotropic segment magnet need not have the same shape and characteristics as those of other anisotropic segment magnets. Also, this anisotropic segment magnet need not be positioned on the same circle where other ones are placed.

The upper electrode is formed by a shower head. Alternatively, the upper electrode may be a mere plate-like electrode. A port through which the process gas is to be introduced may be formed at another location, e.g., in the outer wall of the chamber, and the process gas may be directly supplied into the processing space. In this case, the target substrate can be arranged such that it is supported by the upper electrode.

Industrial Applicability

As has been described above, according to the present invention, a magnetic field forming means can form a strong magnetic field portion locally at a predetermined region located outside that end of a target substrate which is upstream in the electron drift direction. The plasma density of the processing space can accordingly be increased. As a result, when the apparatus of the present invention is used as, e.g., an etching apparatus, uniform etching can be performed under a low pressure. The present invention is thus suitable for etching a device that needs to be micropatterned.

What is claimed is:

1. A magnetron plasma processing apparatus for subjecting a target substrate to a magnetron plasma process, comprising:

a chamber with an outer wall that can maintain reduced pressure;

a pair of electrodes arranged in said chamber to oppose each other and to define a processing space therebetween;

process gas supply means for supplying a process gas into said chamber;

electric field forming means for applying a voltage to said pair of electrodes, thus forming an electric field in the processing space; and magnetic field forming means for forming, in the processing space, a magnetic field perpendicular to a direction of the electric field and directed in one direction, wherein the target substrate is set in the processing space to be parallel to said electrodes, said magnetic field forming means including a dipole ring magnet comprising:

a plurality of first anisotropic segment magnets arranged in a ring-like shape around the outer wall of said chamber so as to form a magnetic field gradient, in a plane perpendicular to the direction of the electric field, such that a magnetic field strength is large and small on upstream and downstream sides, respectively, in an electron drift direction perpendicular to a direction of the magnetic field, one or more adjoining second anisotropic segment magnets arranged proximate to a predetermined region, the predetermined region being located outside that end of the target substrate which is on the upstream side in the electron drift direction, the second anisotropic segment magnets having an N pole thereof being directed toward the predetermined region and a net magnetic force being directed radially toward the center of the dipole ring magnet, and one or more adjoining third anisotropic segment magnets arranged proximate to the predetermined region, the third anisotropic segment magnets having an S pole thereof being directed toward the predetermined region and a net magnetic force being directed radially away from the center of the dipole ring magnet, said second and third anisotropic segment magnets serving to locally increase a magnetic field strength of the predetermined region, such that the magnetic field strength of the predetermined region is larger than a magnetic field strength contributed by said first anisotropic segment magnets alone.

2. A magnetron plasma processing apparatus according to claim 1, wherein said second and third anisotropic segment magnets are disposed in a ring-like shape together with said first anisotropic segment magnets.

3. A magnetron plasma processing apparatus according to claim 2, wherein said second and third anisotropic segment magnets are arranged continuously.

4. A magnetron plasma processing apparatus according to claim 3, wherein said first to third anisotropic segment magnets are columnar magnets of the same strength which are magnetized in one direction, and said first anisotropic segment magnets are arranged such that directions of magnetization thereof are slightly shifted from each other.

5. A magnetron plasma processing apparatus according to claim 4, wherein said first anisotropic segment magnets are arranged such that gaps among those which are on the upstream side in the electron drift direction are narrower than gaps among those which are on the downstream side in the electron drift direction.

6. A magnetron plasma processing apparatus according to claim 1, wherein said first anisotropic segment magnets form a magnetic field with 200 Gauss at maximum at a portion thereof opposing the target substrate, and said first to third anisotropic segment magnets form a magnetic field of at least 200 Gauss at the predetermined region.

7. A magnetron plasma processing apparatus for subjecting a target substrate to a magnetron plasma process, comprising:

a chamber which has an outer wall and can maintain reduced pressure;

process gas supply means for supplying a process gas into said chamber;

a pair of electrodes arranged in said chamber to oppose each other and to define a processing space therebetween;

electric field forming means for applying a voltage to said pair of electrodes, thus forming an electric field in the processing space; and magnetic field forming means for forming, in the processing space between said pair of electrodes, a magnetic field perpendicular to a direction of the electric field and directed in one direction, wherein the target substrate is set in the processing space to be parallel to said electrodes, said magnetic field forming means including a dipole ring magnet comprising:

a plurality of anisotropic segment magnets arranged in a ring-like shape around the outer wall of said chamber, to form a gradient of the magnetic field, in a plane perpendicular to the direction of the electric field between said electrodes, such that a magnetic field strength is large and small on upstream and downstream sides, respectively, in an electron drift direction perpendicular to a direction of the magnetic field;

a first section of one or more adjoining anisotropic segment magnets arranged proximate to a first region, said first region located outside that end of the target substrate which is on the upstream side in the electron drift direction, said first section having an N pole thereof being directed toward the first region and a net magnetic force being directed radially toward the center of the dipole ring magnet; and a second section of one or more adjoining anisotropic segment magnets arranged proximate to a second region, the second region located outside that end of the target substrate which is on the upstream side in the electron drift direction, said second section having an S pole thereof being directed toward the second region and a net magnetic force directed radially from the center of the dipole ring magnet, the first and second sections serving to locally increase magnetic field strengths of the first and second regions, such that the magnetic field strengths of the first and second regions are larger than the corresponding magnetic field strengths contributed by said plurality of anisotropic segment magnets alone.

8. A magnetron plasma processing apparatus according to claim 7, wherein at least another anisotropic segment magnet is arranged between the first and second sections.

9. A magnetron plasma processing apparatus according to claim 8, wherein said anisotropic segment magnets are columnar magnets of the same strength which are magnetized in one direction, and those of said anisotropic segment magnets which are at a portion other than the first and second portions are arranged such that directions of magnetization thereof are slightly shifted from each other.

10. A magnetron plasma processing apparatus according to claim 9, wherein first anisotropic segment magnets are arranged such that gaps between those which are on the upstream side in the electron drift direction are narrower than gaps between those which are on the downstream side in the electron drift direction.

11. A magnetron plasma processing apparatus according to claim 7, wherein said anisotropic segment magnets form a magnetic field with 200 Gauss at maximum at a portion thereof opposing the target substrate, and form a magnetic field of at least 200 Gauss at the predetermined region.

12. A magnetron plasma processing apparatus for subjecting a target substrate to a magnetron plasma process, comprising:

a chamber to which a process gas is to be supplied;

a pair of electrodes arranged in said chamber to oppose each other and to define a processing space therebetween;

electric field forming means for applying a voltage to said pair of electrodes, thus forming an electric field in the processing space;

first magnetic field forming means for forming, in the processing space between said pair of electrodes, a first magnetic field perpendicular to a direction of the electric field and directed in one direction, such that a magnetic field strength of the first magnetic field is large and small on upstream and downstream sides, respectively, of the chamber in an electron drift direction perpendicular to a direction of the magnetic field; and second magnetic field forming means for increasing a magnetic field strength at one or more predetermined regions, the predetermined regions located proximate to and outside of that end of the target substrate on the upstream side in the electron drift direction, the first and second magnetic field forming means forming a maximum magnetic field strength of 200 Gauss above the target substrate and a minimum magnetic field strength of 200 Gauss at the predetermined regions.

13. A magnetron plasma processing apparatus for subjecting a target substrate to a magnetron plasma process, comprising:

a chamber to which a process gas is to be supplied;

a pair of electrodes arranged in said chamber to oppose each other and to define a processing space therebetween;

electric field forming means for applying a voltage to said pair of electrodes, thus forming an electric field in the processing space;

first magnetic field forming means for forming, in the processing space between said pair of electrodes, a first magnetic field perpendicular to a direction of the electric field and directed in one direction, such that a magnetic field strength of the first magnetic field is large and small on upstream and downstream sides, respectively, in an electron drift direction perpendicular to a direction of the first magnetic field; and second magnetic field forming means for increasing a magnetic field strength at one or more predetermined regions, the predetermined regions located proximate to and outside that end of the target substrate which is on the upstream side in the electron drift direction, the first and second magnetic field forming means forming an overall magnetic field gradient, such that the magnetic field strength of the overall magnetic field gradient increases by more than 500 Gauss over a range of 150 mm to 250 mm from the center of the first magnetic field forming means along the electron drift direction.

\* \* \* \* \*

UNITED STATES PATENT AND TRADEMARK OFFICE
CERTIFICATE OF CORRECTION

PATENT NO. : 6,764,575 B1
DATED : July 20, 2004
INVENTOR(S) : Yamasaki et al.

It is certified that error appears in the above-identified patent and that said Letters Patent is hereby corrected as shown below:

<u>Title page,</u>
Item [86], PCT No, should read:
-- [86]   PCT No.:        PCT/JP00/05798

§ 371 (c)(1),
(2), (4) Date:    Mar. 4, 2002 --

Signed and Sealed this

Sixteenth Day of November, 2004

JON W. DUDAS
*Director of the United States Patent and Trademark Office*